United States Patent [19]

Burkhardt

[11] Patent Number: 4,719,368

[45] Date of Patent: Jan. 12, 1988

[54] POWER SUPPLY CONTROL ARRANGEMENT FOR A WATCH STEPPING MOTOR

[75] Inventor: Wolfgang Burkhardt, Ispringen, Fed. Rep. of Germany

[73] Assignee: Pforzheimer Uhren-Rohwerke Porta GmbH, Pforzheim, Fed. Rep. of Germany

[21] Appl. No.: 861,848

[22] Filed: May 12, 1986

[30] Foreign Application Priority Data

May 25, 1985 [DE] Fed. Rep. of Germany ....... 3519008

[51] Int. Cl.[4] ....................... H03K 5/04; H03K 17/08; H03K 19/007

[52] U.S. Cl. .................................... 307/442; 307/267; 307/297; 307/470; 307/269

[58] Field of Search ............... 307/470, 234, 297, 267, 307/269, 442

[56] References Cited

U.S. PATENT DOCUMENTS

| | | | |
|---|---|---|---|
| 3,166,735 | 1/1965 | Clark | 307/470 |
| 3,836,859 | 9/1974 | Behrens et al. | 307/470 |
| 4,420,789 | 12/1983 | Breen | 307/234 |
| 4,494,013 | 1/1985 | Ludowyk | 307/470 |
| 4,502,014 | 2/1985 | Bismarck | 307/470 |

*Primary Examiner*—John S. Heyman

*Attorney, Agent, or Firm*—Nils H. Ljungman

[57] ABSTRACT

In a power supply control arrangement for the stepping motor of a watch an integrated circuit structure is disposed between the stepping motor and its energy source for controlling the supply of drive pulses to the motor. The circuit structure includes means for detecting the motor's non-response and means for supplying a correction pulse upon detection of non-response of the motor. There are further means for applying drive pulses of increased duration following such correction pulse for overcoming excessive loads and also means for shutting off the correction pulse or the energy source if the motor does not respond to the drive pulses of increased duration.

2 Claims, 5 Drawing Figures

POWER SUPPLY CONTROL ARRANGEMENT FOR A WATCH STEPPING MOTOR

BACKGROUND OF THE INVENTION

The present invention relates to a power supply control arrangement for a stepping motor of a watch disposed, in the form of an integrated circuit, between the battery and the stepping motor of the watch, which circuit, for causing a motor step under supervision of a detection system, provides for one or more power pulses controlled in such a manner that the impulses have a torque-load dependent length under normal operation and which provides, subsequent to a power pulse, a correction pulse of a reltively great length when compared to the power pulse length and which is adapted to overcome higher than normal load torques as they may occur as a result of certain disturbances.

Such motor drive control circuitry is used especially in connection with today's modern wristwatches, which must be able to operate over long periods of time and with high precision. In order to achieve the desired precision of operation it is not only necessary to maintain constant pulse intervals which is achievable by means of quartz oscillator circuits but the so-produced impulses must cause the proper advance of the stepping motor.

With older control arrangements this was achieved by providing a relatively long pulse whose energy content was large enough to cause the stepping advance even with some kind of disturbances present. As a result the battery's energy, which in a watch is only a relatively small amount, is consumed quite rapidly so that the battery needs to be replaced relatively often. In connection with modern watches it is however desirable that a battery is capable of energizing the watch's drive over a number of years, preferably for the full design life span of a watch.

In order to be able to satisfy such a requirement it is necessary to reduce the energy consumption per pulse for driving the motor, that is, duration of the pulse must be shortened. There is, however, a limit: the pulse must be sufficiently large to provide the desired rotational step of the stepping motor under normal conditions. Upon occurrence of a disturbance, however, the stepping motor would remain still. In order to prevent such malfunctions, present drive control circuits include detection systems which provide a correction signal whenever the stepping motor has not reacted to a stepping pulse. The correction signal of the detection system will cause the generation of a correction pulse which is large enough to cause a stepping advance of the stepping motor thereby overcoming the disturbance. Since, however, the usual disturbances such as the presence of dirt or undue temperatures remain often for extended periods, the load remains relatively high for those periods so that a correction signal and longer drive pulse are provided for those periods. If the extension of the drive pulse is not sufficient to provide for the desired motor step, the process described above is repeated, that is, an extended correction pulse is again provided and the drive pulse is further increased. The process may be repeated until the largest possible design drive pulse is provided. As a result, under extreme conditions, the largest design drive pulse and the large correction pulse are provided in order to achieve a desired motor step. If rotation of the stepping motor is still not obtained, these large pulses will be provided until the energy of the battery is consumed.

As a result not only will the watch be out of service but also the battery is rapidly—within a couple of weeks—drained of energy. The owner of the watch will naturally assume that the battery has to be replaced especially since, with the greater energy supply of a new battery, the watch will generally overcome the disturbance and operate for a limited time so that the actual problem is not recognized and the quite expensive batteries are replaced in short intervals.

It is therefore the principal object of the present invention to provide for a possibility of recognizing such disturbances and thereby preventing the premature and unnecessary draining of batteries.

This could be achieved by means of an energy-time sensing arrangement which would disconnect the battery if the energy consumption would the excessive over a period of time. Such an arrangement however would be relatively involved and would require substantial changes in the presently existing control circuitry. If it is desirable to avoid extensive changes of an existing control circuit such a solution cannot be utilized.

SUMMARY OF THE INVENTION

The same result can be achieved with a simple power supply control arrangement in which the integrated circuit structure for controlling the drive pulses supplied to the stepping motor of a watch includes means for detecting the motor's non-response, means for supplying a relatively large correction pulse upon detection of non-response to the motor to cause at least a next step and means for applying a follow-up drive pulse of increased duration for overcoming excessive temporary loads. There are further means for shutting off at least the correction pulse if, upon application of the largest design drive pulse, non-response of the stepping motor is still detected. Means may also be provided to shut off the energy supply completely under the given conditions, in order to save the energy supply and as an indication that the energy supply is not the cause of the problem.

There may also be a counter permitting the application of a predetermined number of large drive pulses coupled with non-response of the stepping motor before shut off of the energy supply is executed.

SHORT DESCRIPTION OF THE DRAWINGS

DESCRIPTION OF THE PREFERRED EMBODIMENT

Figure 1:
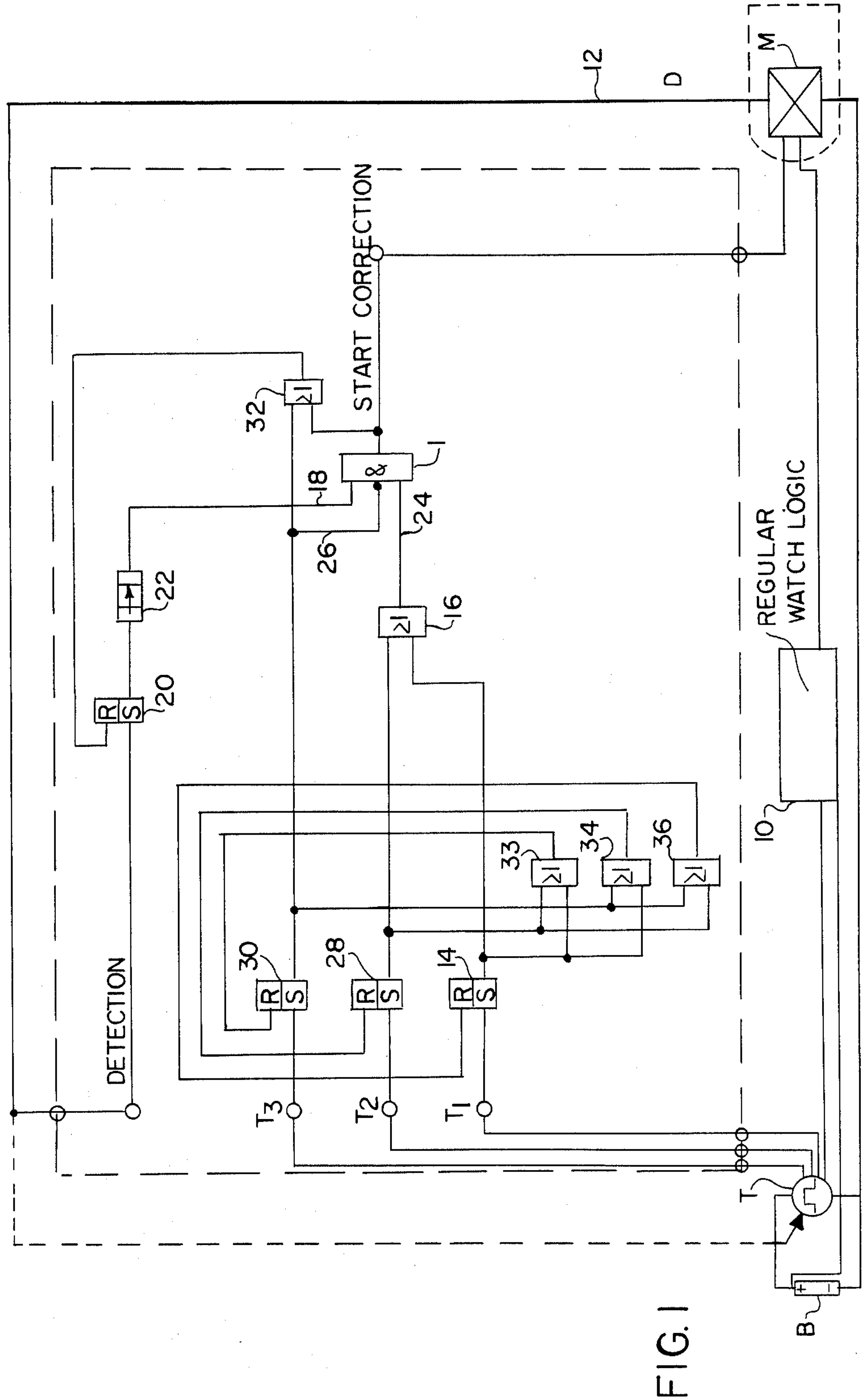
FIG. 1 shows a circuit arrangement for the omission of the correction pulse while retaining the drive pulse.

As shown in FIG. 1, $T_1$, $T_2$ and $T_3$ are the contacts which are energized when the respective drive pulses are provided. $T_1$ indicates the smallest, normal pulse and $T_3$ indicates the largest pulse. The contact designated "Detection" or "Det" (FIG. 2) is energized when the detection system senses that the stepping motor did not advance in spite of the presence of a drive pulse. The connections $T_1$ and $T_2$ provide those drive pulses, which are of shorter duration than $T_3$, to the stepping motor by way of the connections "out 1" and "out 2".

It is apparent from FIG. 1 that, upon presence of a signal at $T_1$ but none at $T_2$ or $T_3$ and further with the absence of a detection signal, the AND gate 1 will not switch on, that is, no correction pulse will be provided. If, however, in addition to the signal from $T_1$, a signal is also present at "Detection", then a correction pulse is provided and, at the same time, the power pulse $T_2$ is provided which is a pulse larger in duration than $T_1$. If the $T_2$ pulse does not advance the stepping motor, another detection pulse is provided which, when present at the gate 1 together with the $T_2$ pulse, causes the generation of a correction pulse and $T_3$ drive pulses. If finally, with a $T_3$ drive pulse present there is still a detection pulse, no correction pulse is provided since this is prevented by the negating "AND" gate of $T_3$. In this case, $T_3$ pulses are continued to be provided but the highest energy correction pulse is not provided such that the watch does not appear to be in order if in face it is not and the battery is not depleted as rapidly.

Figure 2:
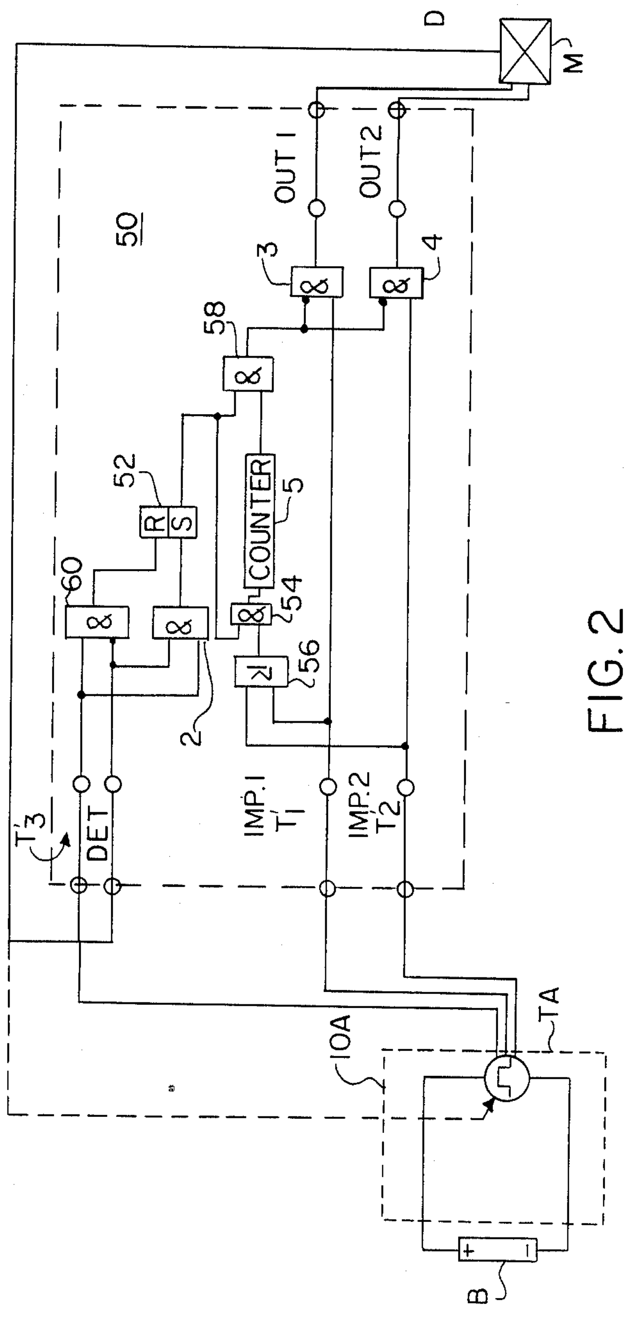
FIG. 2 shows a circuit for the complete interruption of the energy supply under the given undesirable conditions.

In the arrangment of FIG. 2 the final AND gates 3 and 4 are closed if, at the same time, $T_3$ and detection signals are present by way of an AND gate 2 so that also the power supply to the stepping motor is cut off. There may furthermore be provided a counter 5 which permits cut-off of the power supply only after counting a predetermined number of pulses from Imp. 1 or Imp. 2.

In both arrangements there are utilized only relatively minor circuit additions to the drive circuit to achieve the desired result. The arrangement of FIG. 1 requires only the addition of the AND gate 1 which serves to inhibit the correction pulse and the arrangement of FIG. 2 which provides for complete shutdown of the energy supply requires only the addition of the AND gates 2, 3 and 4 and, if desired, the addition of the pulse counter 5.

Referring again to FIG. 1, a regular logic circuit 10 for the watch is shown which provides the low-power pulses to the motor M from the battery B. The regular logic watch circuit 10 is connected in order to provide such power during normal operation from the battery B to the motor M as is required. When the motor malfunctions, such that the power pulses from the regular logic circuit 10 are not sufficient to drive the motor to its next position, a signal D is generated which is carried via a lead 12 to the auxiliary pulse generating circuit T, which then generates a pulse $T_1$, which is fed into a bistable multivibrator 14 and which sets the multivibrator 14 to generate a "one" (1) state at its output which is then fed through an OR circuit, or gate, 16 through the AND circuit 1. This AND circuit 1 has its upper input 18 already set and its middle input 26 in the zero (0) state. Since the AND circuit or gate 1 has an inversion function, shown by the black dot, the output of the AND gate 1 will be in the "one" state. At the same time as it is fed into the T circuit, the detector, or D, signal is also fed into a bistable multivibrator circuit 20, which signal D from the motor M resets the bistable multivibrator circuit 20 into its set, or "one", state, thereby generating a pulse which is fed into a monostable multivibrator 22. The monostable multivibrator 22 generates a relatively long pulse which is then fed to the AND circuit 1 and provides a "one" state for the AND circuit 1 at the upper input 18 while the intermediate, or middle, input 26 has a zero and the lower input 24 has a "one" signal applied thereto. This AND circuit 1 has an inversion function, or not AND input, at its middle input 26. The AND gate 1 produces a relatively long output signal which is then fed to the motor M. This signal is substantially greater in duration and power than the small, or low-power, pulses which are fed from the regular logic 10 of the watch to the motor M. If this pulse from the AND circuit 1 is sufficient in magnitude to power the motor M to its next position, then the next small pulse from the regular logic circuit 10 of the watch is fed to the motor. Unless there is a binding over a number of positions, the motor will usually move onto its next position. Therefore, no D signal will be generated by the motor to energize the circuit T. However, if the motor does not move or if the next position is also difficult to move from, that is, if the regular logic circuit 10 cannot move the hands of the watch, then a second D signal will be generated which will be fed to the bistable multivibrator 20 and also to the circuit T. Upon the occurrence of the second D signal from the motor M, a signal $T_2$ will be generated by the T circuit, which signal $T_2$ will be fed into a bistable multivibrator 28, which signal will set the bistable multivibrator 28, and the output thereof will be fed through an OR gate 16 to the AND circuit 1, thereby producing a second, high-powered pulse for moving the motor M from its position. If the motor M moves to its next position, a further signal D may not be generated when the regular logic circuit 10 energizes the motor once again, and there will be no further D signals generated. However, if the motor is still jammed or requires a great deal of power to move it, that is, much greater than the power generated by the regular logic circuit 10, a third D signal will be generated thereby which will be fed to the circuit T, and a signal $T_3$ will be generated which is then fed to another bistable multivibrator 30. This bistable multivibrator 30 then generates a "one" signal which changes the state of the input of the AND gate 1 at the input 26 from a zero to a one, thereby inhibiting the output of the AND circuit 1. From this period on, no further high-power signals are generated by the logic circuit 1, but the low-power signals from the regular logic circuit 10 are still fed to the watch, which will then undoubtedly remain stopped to indicate that there is something wrong with the operation thereof. In order to facilitate the operation of the circuit, additional OR gates 32, 33, 34 and 36 are connected to the various bistable multivibrators for the resetting thereof at appropriate times during the operation of the circuit. When an output is generated by the bistable multivibrator circuit 14, the bistable multivibrators 28 and 30 are reset into their reset state. When the bistable multivibrator 28 is set into its "one" state, signals are fed back to the bistable multivibrators 30 and 28 to reset them. When the bistable multivibrator 30 is energized into its "one" state, a signal is fed back to the bistable multivibrators 28 and 14 to reset them into their reset states. Also, when the bistable multivibrator 30 or the AND gate 1 generate a "one" output, the bistable multivibrator 20 is reset into its reset state.

The motor M is a typical quartz movement motor for a watch, which motor comprises a coil. When the motor M works normally, the period of the pulse applied thereto is of a duration such that the motor M substantially completes its movement prior to the end thereof. Therefore, the current flowing through the coils of the motor M is relatively small since the inductance to the pulse is relatively large. However, if the motor is jammed and does not move, the inductance of the motor will be relatively small as compared to that in normal operation. This low inductance of the coil will then cause a surge of current through the motor which will drop the voltage thereacross, since the regular logic 10 is connected in series with the coil of the motor. The battery voltage will then distribute itself across the series combination of the logic circuit 10 and the motor M. With the motor M jammed, a very small voltage appears across the coil of the motor M. Therefore, the motor coil will generate a pulse thereacross which is related to this smaller voltage and is fed back as the pulse D when the surge of current passes through the motor M. Alternately, a shunt could be used in series with the coil of the motor M and the voltage thereacross could be fed back as the pulse D when the surge of current passes through the motor M.

Referring now to FIG. 2, which figure has an operation which is different, but similar, to that of FIG. 1 in that, upon the operation of the circuit within the heavily dashed lines 50, the motor is turned off completely. That is, there is no power flowing between the battery and the motor after the completed operation of the circuit 50. The normal operation of the circuit 50 and pulse input "Imp. 2" (Impulse 2), or $T_2'$, and another pulse input "Imp. 1" (Impulse 1), or $T_1'$, are fed through a pair of AND circuits 3 and 4 to produce the outputs "out 1" and "out 2". These outputs "out 1" and "out 2" are preferably of different polarity and drive the stepping motor M first in one sense and then in the other. These pulses $T_1'$ and $T_2'$ are small pulses having short duration to minimize drain on the battery B during normal operation of the watch when no unwanted high loads are present which load the motor M when disturbances occur. This driving of the motor M by small pulses of opposite polarities produces the movement of the motor M first in the one direction of the motor in one period of time, typically a half or a quarter of a second, and subsequently by another movement in the other direction in the same period of time after the first period of time. Because of this characteristic of motors of quartz wristwatches which move the hands thereof, AND gates, that is, the AND gate 3 and the AND gate 4, are required to transmit these small pulses as described supra. However, in other designs, only one AND gate may be required to fall within the scope of the invention. In the event that the motor M experiences resistance to movement, such as in the similar case of the the operation of the motor of FIG. 1, the detector or detection pulse D is generated which is fed back to the circuit TA, which then generates a pulse which is fed into the $T_3'$ input of the circuit 50. In addition, the detector pulse D is fed into an input Det. When the circuit TA detects a pulse D from the motor M, the circuit TA generates pulses which are longer in time than those of the "small" pulses already described in the operation of FIG. 2 immediately above. These longer pulses then drive the motor with a greater amount of energy than that of the ordinary small pulses, which small pulses are relatively short in magnitude as compared to the longer pulses and which small pulses are generated when the detector signal D is not generated by the motor M. The detection pulse from the motor is of relatively long magnitude compared to the time span between the pulses at "Imp. 1" ($T_1'$) and "Imp. 2" ($T_2'$). $T_3'$ is also of a relatively larger or longer magnitude than the time of the pulses "Imp. 1" ($T_1'$) and "Imp. 2" ($T_2'$) which drive the motor during normal operation.

The two pulses $T_3'$ and D are fed through the AND gate 2, and when they both exist at the same period of time, as they will when the motor is malfunctioning and generating the signal D, they set the bistable multivibrator 52, which then generates a "one" signal which is fed to the AND circuit 54. The signals from the "Imp. 1" ($T_1'$) and "Imp. 2" ($T_2'$) are joined by an OR circuit 45 as inputs thereto, and the output of OR circuit 56 appears as one of the inputs of the AND circuit, or gate, 54. The upper input of the AND circuit 54 will exist as long as there is any signal D generated by the motor, indicating that the motor is not functioning properly. The output of the AND circut 54 is connected to an input of a counting circuit 5, which counting circuit 5 will yield an output when it has counted to its capacity, which is typically around 60 pulses. The output of the counting circuit 5 is connected to an input of another AND circuit 58, which also has as its other input the output from the bistable multivibrator circuit 52, which bistable multivibrator circuit 52 indicates that there is a malfunction in the motor M. When the required number of pulses has been counted by the counting circuit 5 and a malfunction still exists at the motor M, the AND circuit 58 will yield an output which will go into the negating, or inhibit, inputs of the AND circuits 3 and 4 and turn the AND circuits 3 and 4 off. This will disconnect the motor M from the battery B and, therefore, reduce the drain on the battery D to essentially the shelf life drain thereof.

In an alternative embodiment, the circuit TA may have different pulse widths for a different number of pulses D from the motor M, such that, the first pulses may be of a shorter duration and pulses subsequent thereto may be of longer duration for even more power to move the motor to its binding or malfunctioning position. In the event that the signal $T_3'$ still exists even after the signal D from the motor M has gone to a zero position, the AND circuit 60, which has an inhibit at the detection, or D pulse signal position, will then reset the bistable multivibrator 52 and, thereby, inhibit a pulse or pulses from the output of the AND gate 2 from reaching the AND gate 58 and the AND gate 54 and, therefore, ultimately inhibit the AND gates 3 and 4, thereby turning the watch off. It should be noted that it is the circuit TA which generates the longer pulses in this embodiment and not as in FIG. 1 where the additional circuitry shown therein generates these longer pulses.

Figure 3:
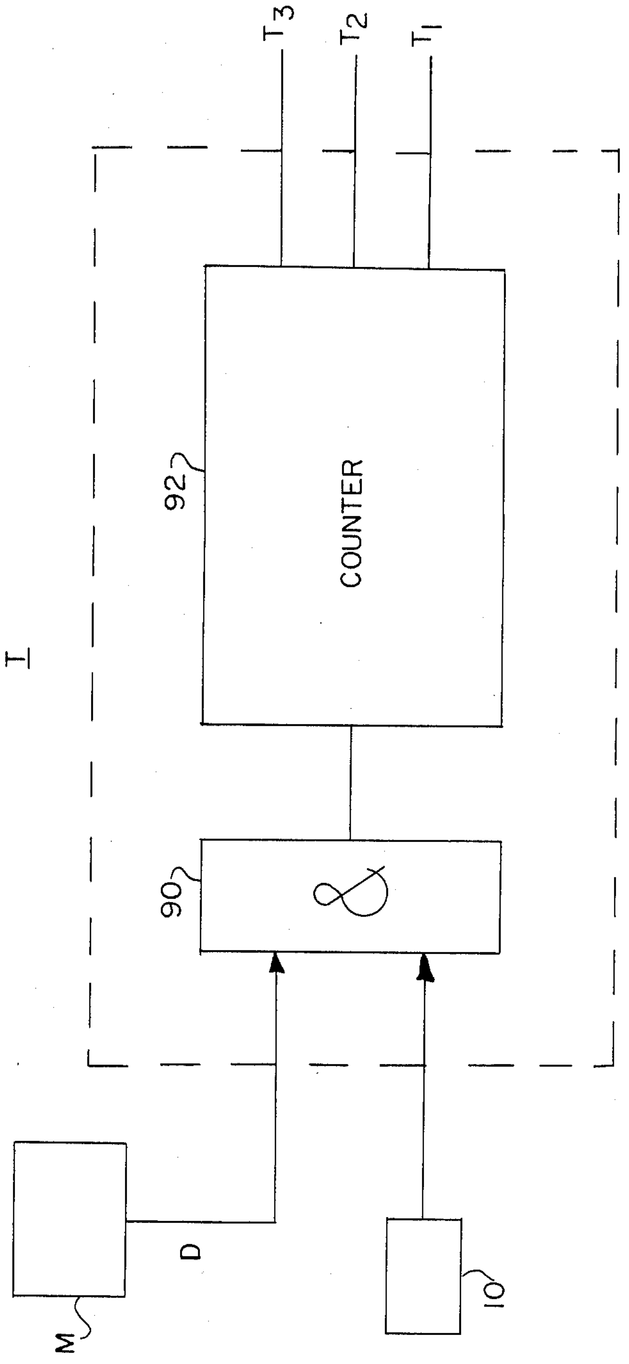
FIG. 3 shows a logic circuit block diagram of an embodiment of the present invention.

The circuit T, as shown in FIG. 3, comprises an AND gate 90 which is energized when the regular logic circuitry provides a pulse thereto which has a time spacing which is typical of the small pulses emanating from the regular watch logic 10. When the detection pulse D is present indicating a jammed motor, the AND gate 90 will permit a pulse to flow therethrough. The output pulse from the AND circuit 90 is fed to a counter circuit 92 which provides the three outputs, $T_1$, $T_2$ and $T_3$ of the circuit T, which circuit T is shown as a dotted square in this FIG. 3. The counter circuit 92 provides a pulse $T_1$ when the first pulse is passed through the AND gate 90 and the second pulse $T_2$ when the second pulse is passed through the AND gate 90 and the pulse $T_3$ when the third pulse is passed through this AND gate 90.

The circuit TA of FIG. 2 and the motor M of FIG. 2 function in an analogous fashion. However, the circuit TA provides pulses therethrough for operation of the watch also during ordinary operating conditions. This circuit TA is a portion of the ordinary logic circuit of the integrated circuit chip 10A. The circuit TA also has a counter therein as T does, but it only energizes $T_3'$ when the second detector pulse D comes through from the motor M. This circuit TA also has a monostable multivibrator circuit, such as monostable multivibrator 22, connected to the $T_3'$ output in order to provide the longer pulse for the $T_3'$ signal. In the embodiment of FIG. 2, the circuit TA also provides intermediate pulse duration signals for "Imp. 1" ($T_1'$) and "Imp. 2" ($T_2'$).

Typically, the ordinary pulses for watch operation are in the order of 50 to 100 milliseconds, whereas the intermediate pulses are in the order of up to 150 to 175 milliseconds, or even 200 milliseconds, and the extra-long pulses generated at the $T_3'$ output of the TA circuit are in the order of from 150 to 250 and even up to 300 milliseconds. these are only examples of what the pulses may be, and they could be shorter or longer depending upon the design of the particular coil of the stepping motor M. Typically, the pulses for running a quartz watch are about a quarter or one-half second apart and may even be as far apart as one whole second in unusual types of designs. Also, the pulses could move less than every one-quarter of one second, depending upon the design of the particular watch.

Figure 4:
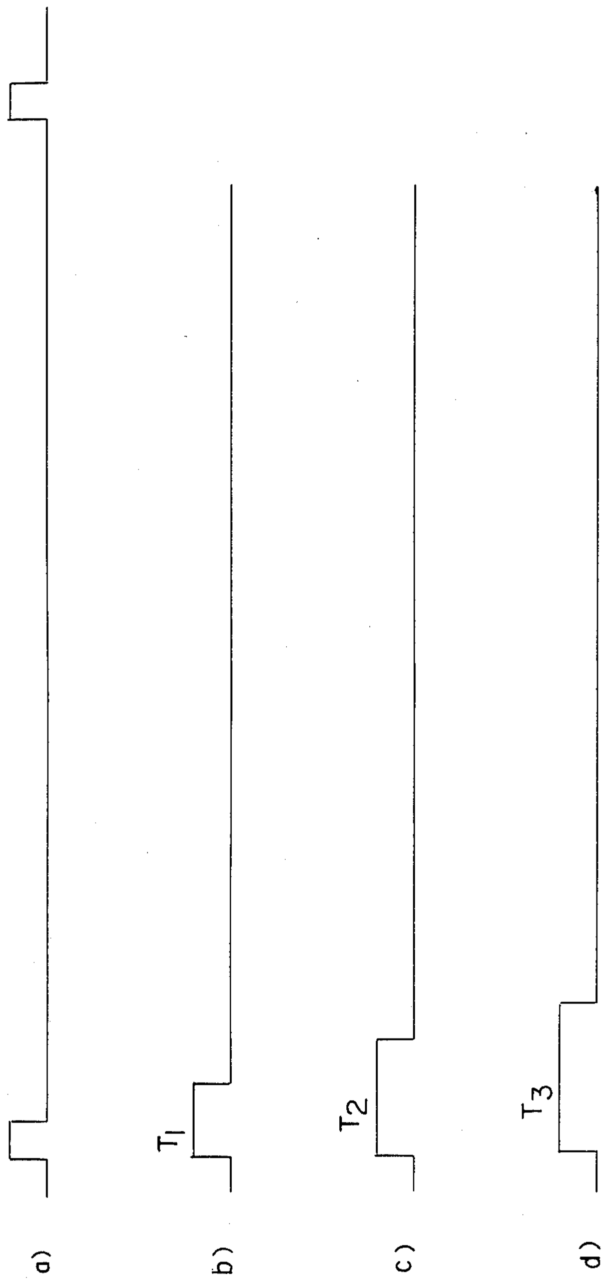
FIGS. 4 and 5 show waveforms of embodiments of the present invention.

FIG. 4 shows typical wave forms, both to the pulses feeding the watch motor M during ordinary operation (a) and the pulses representing $T_1$, $T_2$ and $T_3$, which are labeled (b), (c) and (d) respectively.

Figure 5:
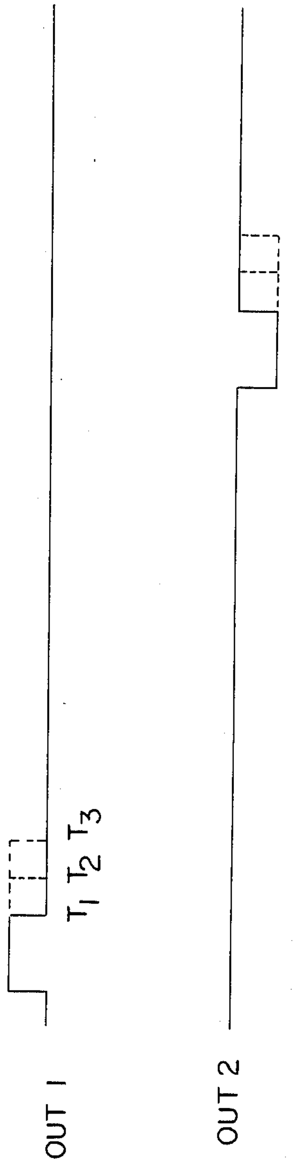

FIG. 5 shows the output pulses of the AND gates 3 and 4 respectively with the time space between pulses of one second. The short pulses shown in full lines and lengthened second and third pulses are shown in dotted lines as extensions of the solid pulses.

The invention as described hereinabove in the context of the preferred embodiments is not to be taken as limited to all of the provided details thereof, since modifications and variations thereof may be made without departing from the spirit and scope of the invention.

I claim:

1. A power supply control arrangement for a stepping motor of a watch, comprising an integrated circuit structure disposed between an energy source and said stepping motor for controlling the supply of drive pulses of predetermined duration from said energy source to said stepping motor, said circuit structure comprising means for detecting non-response of said stepping motor to the application of a drive pulse, means for applying at least one correction pulse upon detection of non-response of said stepping motor, said means for applying said at least one correction pulse including means for applying a drive pulse of increased duration upon application of such correction pulse for overcoming excessive loads as they may be caused by disturbances, said means for detecting non-response of said stepping motor connected to said means for applying said at least one correction pulse; and at least one AND gate operably connected to said detection means and said drive pulse applying means so as to cause shut off of at least one of said correction pulse from said means for applying said at least one correction pulse and integrated circuit structure from said energy source.

2. A control arrangement according to claim 1, wherein said integrated circuit structure further includes a counter so arranged as to count the occurrences of the presence of pulses of increased duration and the detection of non-response of said stepping motor and adapted to provide a shut off signal to said integrated circuit structure upon counting a predetermined number of such occurrences for causing said shut off.

* * * * *